United States Patent [19]

Rauscher

[11] Patent Number: 4,670,722

[45] Date of Patent: Jun. 2, 1987

[54] FET OSCILLATOR HAVING CONTROLLABLE REACTANCE ELEMENT-CONTROLLED TWO PORT FEEDBACK NETWORK

[75] Inventor: Christen Rauscher, Oxon Hill, Md.

[73] Assignee: The United States of America as represented by the Secretary of the Navy, Washington, D.C.

[21] Appl. No.: 241,952

[22] Filed: Mar. 9, 1981

[51] Int. Cl.[4] ............................................. H03B 5/18
[52] U.S. Cl. ........................ 331/117 FE; 331/117 D; 331/177 V
[58] Field of Search .......... 331/36 C, 117 R, 117 FE, 331/117 D, 177 V; 332/30 V

[56] References Cited

U.S. PATENT DOCUMENTS

| | | | |
|---|---|---|---|
| 3,281,699 | 10/1966 | Harwood | 331/117 FE |
| 3,370,254 | 2/1968 | Keller | 331/36 C X |
| 3,421,111 | 1/1969 | Boyajian | 331/177 V |
| 3,582,823 | 6/1971 | Pasos | 331/117 D X |
| 4,010,428 | 3/1977 | Sunkler | 331/117 D X |
| 4,135,168 | 1/1979 | Wade | 331/117 FE |
| 4,149,127 | 4/1979 | Murakami et al. | 331/117 D X |

OTHER PUBLICATIONS

Rauscher, "Broadband Varactor-Tuned GaAs F.E.T. Oscillator", Electronics Letters, vol. 16, No. 14, Jul. 3, 1980, pp. 534, 535 (331-177V).
Farell, "Designing FET Oscillators", EEE, Jan. 1967, pp. 86-90, 331-117 FE.

Primary Examiner—Siegfried H. Grimm
Attorney, Agent, or Firm—John L. Forrest; Alan P. Klein

[57] ABSTRACT

A broadband high frequency power oscillator employing a GaAs FET transistor and a two-port coupling network whose input port is connected across the drain and source terminals of the GaAs FET. The coupling network consists of 3 branches in T- or $\pi$-configuration. One branch includes a matching network and the load. The other two branches are purely reactive and each includes at least one independently tunable reactance element, such as a varactor.

5 Claims, 4 Drawing Figures 4,670,722

FET OSCILLATOR HAVING CONTROLLABLE REACTANCE ELEMENT-CONTROLLED TWO PORT FEEDBACK NETWORK

BACKGROUND OF THE INVENTION

This invention relates generally to oscillators and more particularly to high power field-effect transistor oscillators.

Gallium arsenide field effect transistor oscillators (hereinafter GaAs FET oscillators) have proven particularly useful as high power, high frequency microwave oscillators. Such oscillators as set forth, for example in U.S. Pat. No. 4,135,168, issued to Paul C. Wade on June 16, 1979, typically utilize a GaAs FET connected in a common-drain configuration oscillator. Positive feedback is provided through a frequency-determining network that employs a single independently voltage-tunable circuit element, such as a varactor diode. Varactor diodes are semiconductor devices characterized by a voltage sensitive capacitance that resides in the space charge region at the surface of the semiconductor bounded by an insulating layer and which may be used to tune the capacitance of a tuned circuit. Heretofore, these oscillators have not been capable of achieving maximum tuning bandwidth with the GaAs FET operating at optimum efficiency across the band.

SUMMARY OF THE INVENTION

Accordingly, it is an obJect of the present invention to improve field-effect transistor performance characteristics in oscillators.

Another object is to provide an efficient broadband tunable field effect transistor oscillator.

A further object is to provide a broadband tunable field-effect transistor oscillator that is capable of generating maximum radio frequency output power without spurious oscillations.

The objects of the present invention are achieved by an oscillator that includes a field-effect transistor and a two-port coupling network whose input port is connected across the drain and source of the field effect transistor and whose output port is connected across the gate and source of the field-effect transistor. The coupling network consists of three branches, characterized such that the impedance of the first and second branches is purely reactive, while the impedance of the third branch, which includes the load, is complex. The first and second branches include respective voltage or current-controllable reactance elements, which are independently controllable, to tune the oscillator. The use of more than one independently-controllable reactance element in the coupling network permits maximum tuning bandwidth to be achieved by the oscillator with the field-effect transistor operating at optimum efficiency across the band.

Additional advantages and features will become apparent as the subject invention becomes better understood by reference to the following detailed description when considered in connection with the accompanying drawings, wherein:

DESCRIPTION OF THE PREFERRED EMBODIMENTS

Figure 1:
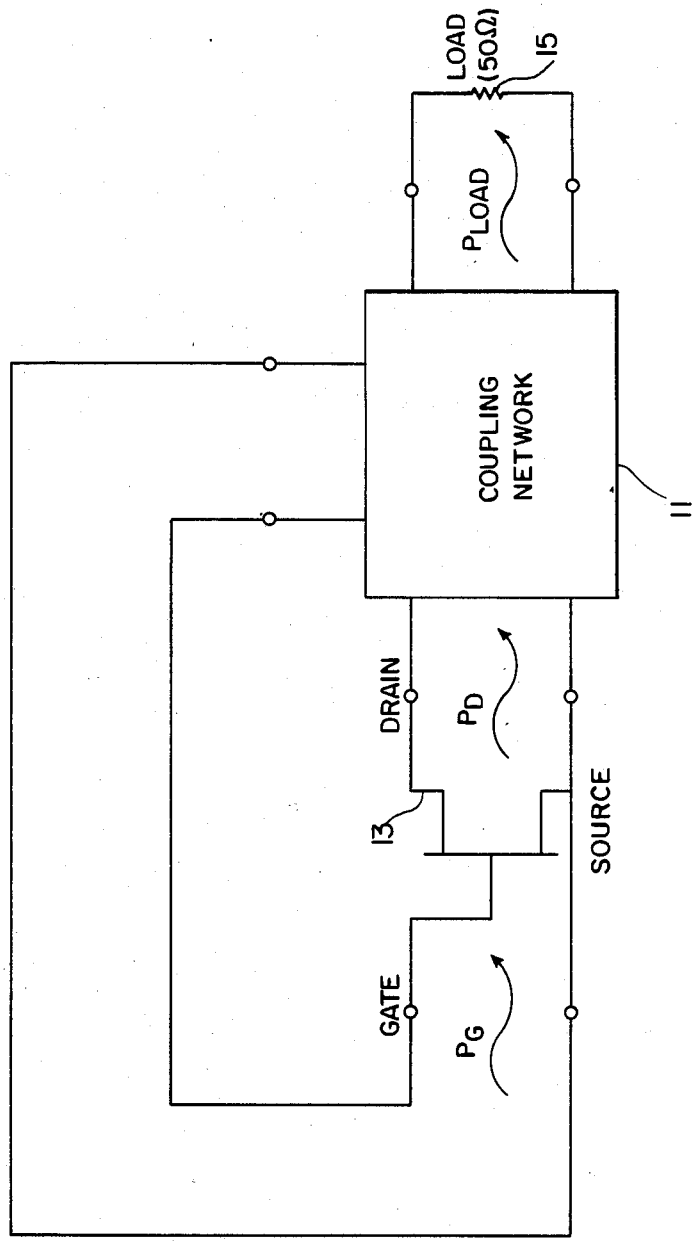
FIG. 1 is a block diagram of a sinusoidal oscillator.

FIG. 1 illustrates a sinusoidal oscillator comprising a lossless 3-port coupling network 11 having an input port connected across the drain and source terminals of a GaAs FET 13 for receiving amplified signal power $P_D$, a coupled output port connected across the gate and the source terminals of the GaAs FET for feeding back a fraction $P_G$ of the signal power to the input of the GaAs FET 13 to maintain oscillations, and a direct output port connected across the terminals of an external load 15, typically a 50 ohm resistor, for providing transmitted signal power $P_{Load}$.

Figure 2A:
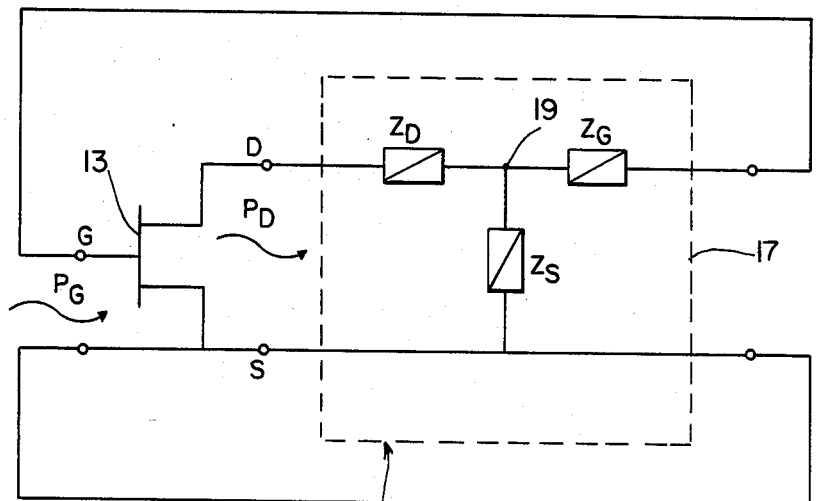
FIGS. 2(a) and 2(b) are diagrams of equivalent circuits of the oscillator of FIG. 1 in accordance with the invention.
Figure 2B:
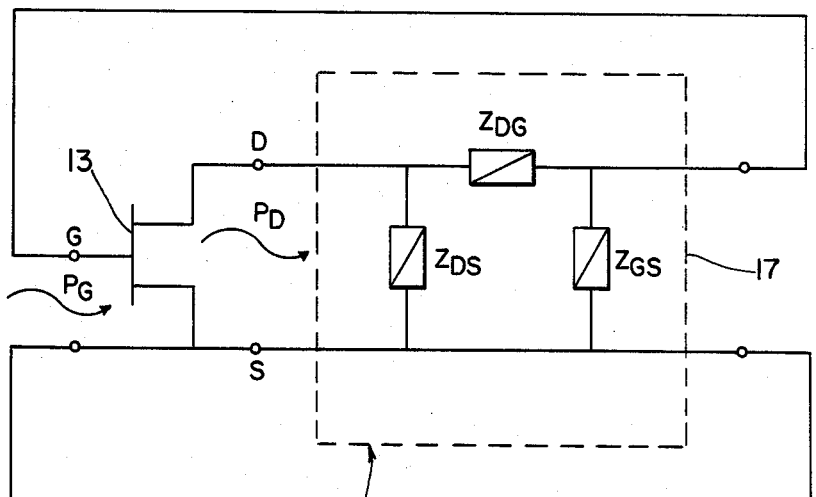

FIGS. 2(a) and 2(b) illustrate two circuit equivalents of the sinusoidal oscillator depicted in FIG. 1 wherein the 3-port coupling network has been replaced by a 2-port equivalent circuit 17 having no direct output port, and wherein the 50 ohm load has been absorbed into the 2-port equivalent circuit. The specific details of the 2-port coupling network 17 have been derived by detailed circuit analysis and, in accordance with the invention, are such as to produce a maximum radio frequency output power $P_{Load}$ for given bias conditions, while insuring that there is only one stable state of oscillation. Specifically, the 2-port coupling network 17 has an input port connected across the in D and source S terminals of the GaAs FET 13 and an output port connected across the gate G and source S terminals of the GaAs FET, and consists of three branches, the impedance of the first and second branches being purely reactive, and the impedance of the third branch, which includes the load, being complex.

FIG. 2(a) illustrates the three branches connected in T-configuration, each branch radiating outwardly from node 19 to the drain D, source S and gate G terminals, respectively, of the GaAs FET 13. If the respective impedances of the three branches are denoted by $Z_D$, $Z_S$ and $Z_G$, three permutations of the circuit of FIG. 2(a) are possible with either $Z_D$, $Z_S$ or $Z_G$ corresponding to the branch that includes the load, while the remaining branches have purely reactive impedances.

FIG. 2(b) illustrates the three branches connected in $\pi$-configuration with the two legs of the $\pi$ respectively connected between the drain D and source S terminals of the GaAs FET 13 and between the gate G and source S terminals of the GaAs FET, and the top member of the $\pi$ connected between the drain D and gate G terminals of the GaAs FET. If the respective impedances of the three branches are denoted by $Z_{DS}$, $Z_{GS}$ and $Z_{DG}$, three permutations of the circuit of FIG. 2(b) are also possible with either $Z_{DG}$, $Z_{GS}$ or $Z_{DG}$ corresponding to the branch that includes the load, while the remaining branches have purely reactive impedances.

When the sinusoidal oscillator depicted in FIGS. 2(a) and 2(b) is to be used as a broadband tuned oscillator, the detailed circuit analysis requires the purely reactive impedances of the first and second branches to decrease monotonically with frequency of oscillation. In practice, this condition can only be realized by disposing voltage or current-controllable reactance elements such as varactors or YIG devices, in the first and second branches. That is, two independently controllable reactance elements are required to achieve optimum broadband tunable performance.

Figure 3:
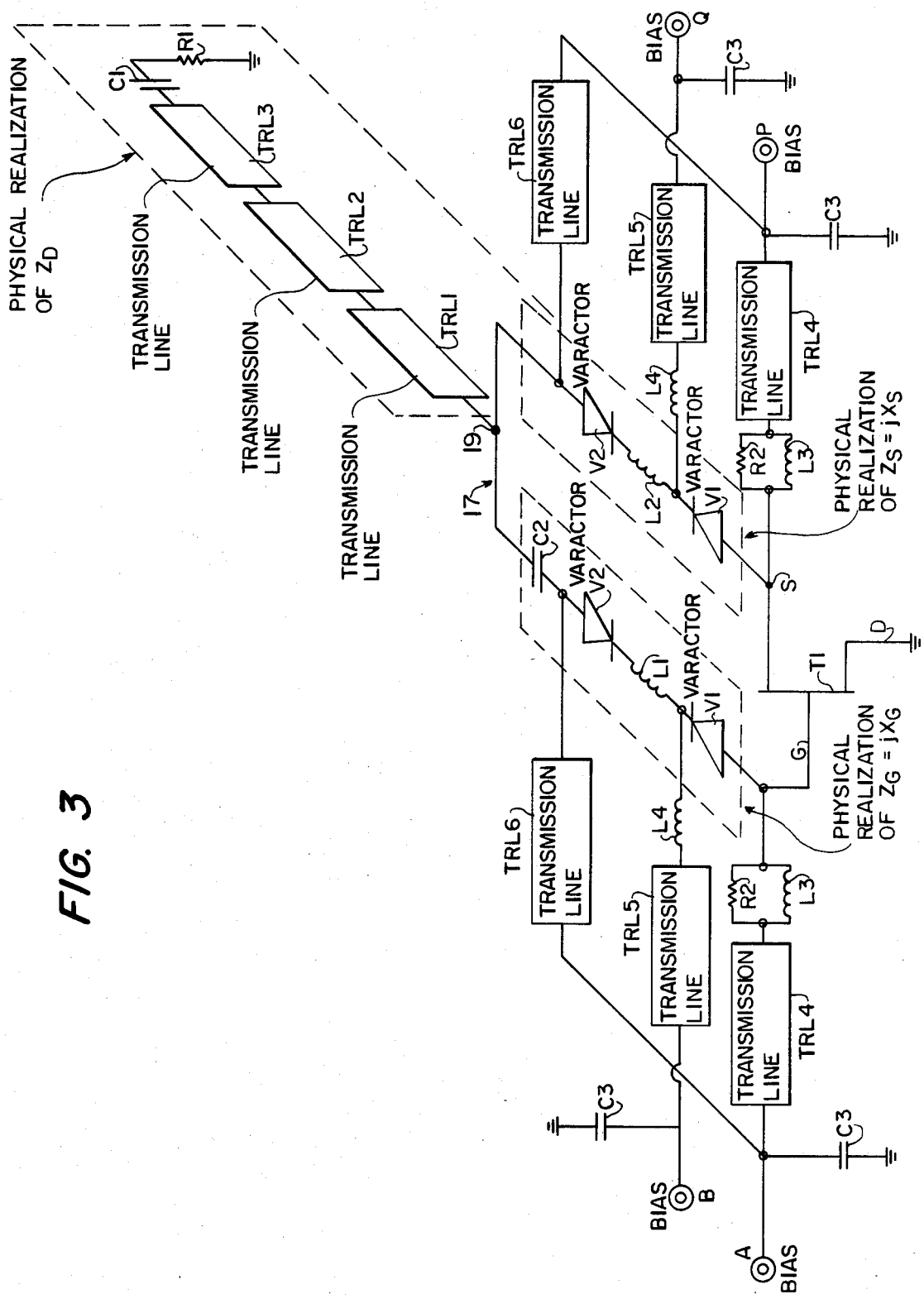
FIG. 3 is a detailed circuit diagram of one embodiment of the oscillator of FIG. 2(a).

FIG. 3 is a detailed circuit diagram of a voltage-controlled oscillator representing one embodiment of the invention which has been generally depicted in FIG. 2(a) and 2(b). The oscillator shown in FIG. 3 includes a 2-port coupling network 17 whose input port is connected across the drain D and source S terminals of a GaAs FET T1, and whose output port is connected across the gate G and source S terminals of the GaAs FET. The drain D terminal of the GaAs FET is grounded. The two port network 17 consists of three branches which are connected in T-configuration and radiate outwardly from a node 19 to the drain D, source S and gate G terminals respectively of the GaAs FET T1. If, as before, the respective impedances of the 3 branches are denoted by $Z_D$, $Z_S$ and $Z_G$, then $Z_D$ corresponds to the branch that includes the load R1 while the remaining branches have purely reactive impedance $Z_S$ and $Z_G$. The complex impedance $Z_D$ is realized as the driving point impedance of a matching circuit that consists of a cascade of three transmission-line elements TRL1, TRL2, and TRL3 terminated via a DC blocking capacitor C1 in the external 50 ohm load resistance R1. The purely reactive impedances $Z_S$ and $Z_G$ of the remaining branches are each implemented by a pair of hyperabrupt varactors V1 and V2 connected in series opposition by a bondwire inductance coil.

The oscillator includes bias means for biasing the GaAs FET, and control means for independently controlling the pair of varactors V1. V2 in the first branch and the pair of varactors V1, V2 in the second branch. While the bias means may take a variety of forms, such means may conveniently take the form illustrated in FIG. 3 wherein an appropriate dc voltage is applied from a first bias terminal A to the gate G terminal of the GaAs FET T1 via a transmission line element TRL4 in series with a bias coil L3, and another appropriate dc voltage is applied from a second bias terminal P to the source S terminal of the GaAs FET T1 via a transmission line element TRL4 in series with a bias coil L3. The bias coils L3 are each shunted by a respective stabilizing resistor R2 to provide suppression of any potential out-of-band spurious oscillations. While the control means may take a variety of forms, such means may conveniently take the form illustrated in FIG. 3 wherein an appropriate DC voltage is applied from a third bias terminal B to the junction in the first branch of one varactor V1 and its associated inductance coil L1, and the voltage from the bias terminal A is applied to the junction of the other varactor V2 in the first branch and one terminal of a DC blocking capacitor C2 whose other terminal is connected to node 19; and wherein an appropriate DC voltage is applied from a fourth bias terminal Q to the Junction in the second branch of one varactor V1 and its associated inductance coil L2, and the voltage from the bias terminal P is applied to the junction of the node 19 and the other varactor V2 in the second branch. The bias terminals A, B, P and Q are each shunted to ground by RF bypass capacitors C3. The oscillating frequency is tuned by simultaneously varying the potential difference between terminals A and B, and between terminals P and Q, to change the capacitances of the varactors V1 and V2 in each branch.

A particular set of values which has provided satisfactory operation of the embodiment shown in FIG. 3 is set forth below. It will be appreciated that these values are by way of example only.

| EXAMPLE |
| --- |
| T1: Avantek M110 GaAs FET |
| TRL1: Characteristic Impedance $Z_0$ = 13 ohms, Electrical Length $\theta$ = 89° at 10 GHz. |
| TRL2: $Z_0$ = 31 ohms, $\theta$ = 121° at 10 GHz. |
| TRL3: $Z_0$ = 44 ohms, $\theta$ = 128° at 10 GHz. |
| TRL4, TRL5, TRL6: $Z_0$ = 120 ohms, $\theta$ = 90° at 10 GHz. |
| V1, V2: Microwave Associates MA 46629 Varactor |
| L1: .6 nH. |
| L2: .59 nH. |
| L3,L4: 20 nH. |
| C1, C2, C3: 40 pF. |
| R1, R2: 50 ohms |

With the above values for the various circuit elements, output powers $P_{Load}$ within 1.5 dBm of 16.5 dBm were obtained over a 7.4 to 13.1 GHz tuning range.

Obviously, numerous additional modifications and variations of the present invention are possible in light of the above teachings. It is therefore to be understood that within the scope of the appended claims the invention may be practiced otherwise than as specifically described.

What is claimed as new and desired to be secured by Letters Patent of the United States is:

1. An oscillator for delivering maximum radio frequency output power to a load and comprising:
   a field-effect transistor having a surce terminal, a gate terminal and a drain terminal; and
   a two-port network having an input port connected across the drain and the source terminals of the field-effect transistor, and an output port connected across the gate and the source terminals of the field-effect transistor, the network consisting of three branches connected in T-configuration, each branch radiating outwardly from a node to the drain, source and gate terminals of the field-effect transistor respectively, each of the first and second branches including a controllable reactance element comprising a first varactor and each of the first and second branches includes a second varactor connected in series with the first varactor by an inductance coil, and the third branch including the load.

2. The oscillator recited in claim 1 including:
   control means for independently controlling the varactors in the first branch and the varactors in the second branch.

3. The oscillator recited in claim 2 wherein:
   the third branch is connected to the drain terminal of the field-effect transistor.

4. The oscillator recited in claim 3 wherein the third branch includes:
   a matching circuit terminated in the load.

5. The oscillator recited in claim 4 wherein the matching circuit includes:
   a cascade of transmission line elements.

* * * * *